United States Patent
Maa et al.

(10) Patent No.: US 6,627,919 B2
(45) Date of Patent: Sep. 30, 2003

(54) THERMALLY STABLE NICKEL GERMANOSILICIDE FORMED ON SIGE

(75) Inventors: Jer-shen Maa, Vancouver, WA (US); Douglas James Tweet, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/319,312

(22) Filed: Dec. 12, 2002

(65) Prior Publication Data

US 2003/0124780 A1 Jul. 3, 2003

Related U.S. Application Data

(62) Division of application No. 09/834,488, filed on Apr. 12, 2001, now Pat. No. 6,506,637.
(60) Provisional application No. 60/278,553, filed on Mar. 23, 2001.

(51) Int. Cl.[7] .............................................. H01L 29/76
(52) U.S. Cl. ............................. 257/67; 257/51; 257/52; 257/64; 257/65; 257/66; 257/67; 257/68; 257/69; 257/347

(58) Field of Search .............................. 257/51, 52, 64, 257/65, 66, 67, 68, 69, 347

(56) References Cited

U.S. PATENT DOCUMENTS 6,242,779 B1 * 6/2001 Maekawa .................... 257/347

* cited by examiner

*Primary Examiner*—David Nelms
*Assistant Examiner*—Mai-Huong Tran
(74) *Attorney, Agent, or Firm*—David C. Ripma; Matthew D. Rabdau; Scott C. Krieger

(57) ABSTRACT

A thermally stable nickel germanosilicide on SiGe integrated circuit device, and a method of making the same, is disclosed. During fabrication of the device iridium or cobalt is added at the Ni/SiGe interface to decrease the sheet resistance of the device. The device comprising nickel silicide with iridium on SiGe shows thermal stability at temperatures up to 800° C. The device comprising nickel silicide with cobalt on SiGe shows a decrease in the sheet resistance with temperature, i.e., the resistance remains low when annealing temperatures extend up to and beyond 800° C.

14 Claims, 2 Drawing Sheets

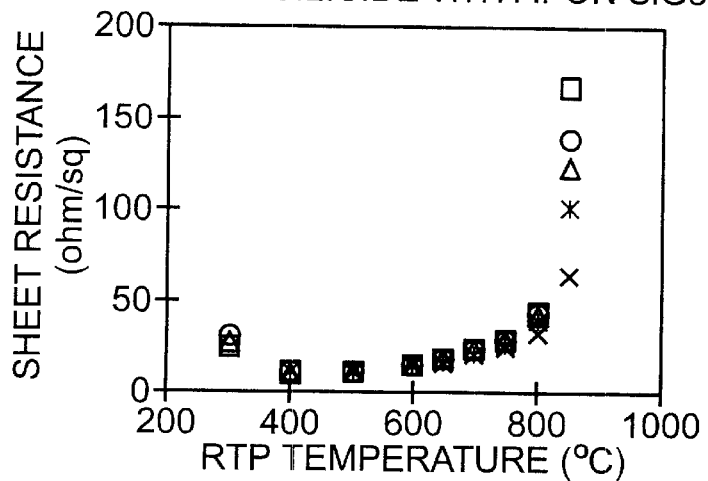
Fig. 4 NICKEL SILICIDE WITH Ir ON SiGe
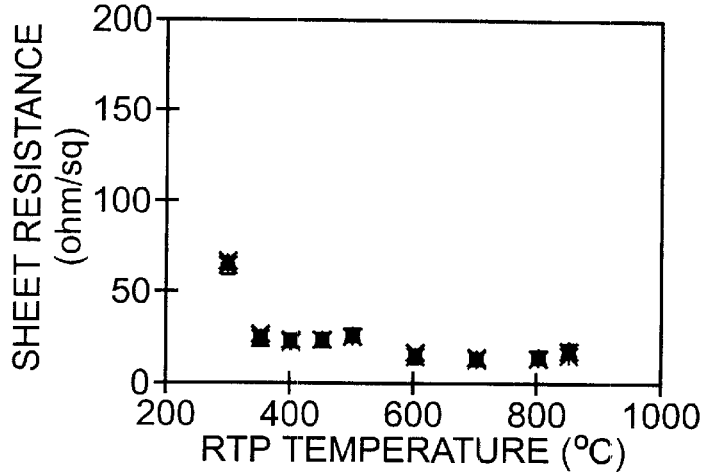
Fig. 5 NICKEL SILICIDE WITH Co ON SiGe
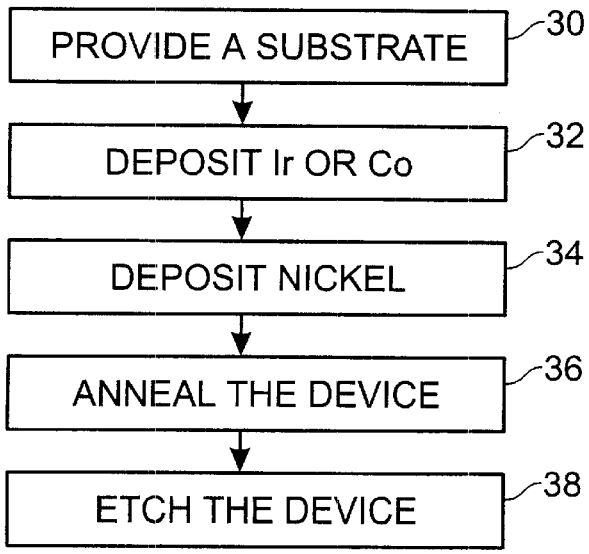
Fig. 6

THERMALLY STABLE NICKEL GERMANOSILICIDE FORMED ON SIGE

CROSS-REFERENCE TO RELATED APPLICATIONS

This application is a divisional of application Ser. No. 09/834,488, filed Apr. 12, 2001 now U.S. Pat. No. 6,506,637, which claims the benefit of U.S. Provisional Application No. 60/278,553 filed Mar. 23, 2001, both of which are entitled "Method to Form Thermally Stable Nickel Germanosilicide on SiGe," invented by Jer-shen Maa et al., now U.S. Pat. No. 6,506,637.

FIELD OF THE INVENTION

This invention relates to a nickel germanosilicide on SiGe integrated circuit device, and a method of making the same and, more particularly, to a thermally stable nickel germanosilicide on SiGe integrated circuit device, and a method of making the same, wherein during fabrication iridium or cobalt is added at the Ni/SiGe interface to decrease the sheet resistance of the device.

BACKGROUND OF THE INVENTION

The development of Si-Ge based integrated circuit devices has created the need for stable, low thermal budget, low resistivity metal-silicide contacts to SiGe alloys. Metal/SiGe systems based on titanium, cobalt, zirconium, nickel, palladium and platinum have been studied. However, these systems show poor phase segregation. In particular, during the thermal anneal, in the Ti/SiGe system, excess germanium combines with silicon and nucleates as SiGe precipitates along the grain boundaries. In the Co/SiGe system, excess Ge diffuses to the grain boundary to form Ge-enriched clusters. Due to this multi-phase formation, application of these materials to devices with small feature sizes is difficult unless a silicon buffer layer is used.

Recently, nickel has been applied to poly-silicon germanium (poly-SiGe) to form nickel germanosilicide poly-silicon germanium ($Ni(Si_xGe_{1-x})$/poly-$Si_{0.8}Ge_{0.2}$) gate structures without a polysilicon buffer layer. Use of this structure has been demonstrated to result in a ten percent increase of the saturated drain current (Idsat) in 0.15 $\mu$m pMOSFET. However, the thermal stability of this nickel germanosilicide is very poor. A sharp increase in the sheet resistance is observed at about 600° C. Accordingly, there is a need to improve the thermal stability of nickel germanosilicides.

SUMMARY OF THE INVENTION

The system of the present invention provides a thermally stable nickel germanosilicide on SiGe integrated circuit device, and a method of making the same, wherein during fabrication iridium or cobalt is added at the Ni/SiGe interface to decrease the sheet resistance of the device. The device comprising nickel silicide with iridium on SiGe shows thermal stability at temperatures up to 800° C. The device comprising nickel silicide with cobalt on SiGe shows a decrease in the sheet resistance with temperature, i.e., the resistance remains low when annealing temperatures extend up to and beyond 800° C.

Accordingly, an object of the invention is to provide a thermally stable nickel germanosilicide on SiGe integrated circuit device, and a method of making the same.

Another object of the invention is to provide a thermally stable nickel germanosilicide on SiGe integrated circuit device, and a method of making the same, wherein during fabrication iridium or cobalt is added at the Ni/SiGe interface.

Still another object of the invention is to provide a thermally stable nickel germanosilicide on SiGe integrated circuit device that has a low sheet resistance at temperatures up to 800° C. or more.

BRIEF DESCRIPTION OF THE DRAWINGS

FIG. 4 is a plot of the annealing temperature versus the sheet resistance for nickel germanosilicide with iridium on SiGe.

FIG. 5 is a plot of the annealing temperature versus the sheet resistance for nickel germanosilicide with cobalt on SiGe.

FIG. 6 is a flowchart of the method of the present invention.

DETAILED DESCRIPTION OF THE PREFERRED EMBODIMENTS

The present invention comprises adding iridium or cobalt into nickel silicide structures. The thermal stability of the devices formed is much improved both on single-crystal silicon and on amorphous silicon, compared to nickel silicide devices without added iridium or cobalt. The advantage of the inventive nickel silicide films with iridium or cobalt is especially beneficial in the fabrication of ultra-shallow junctions, for example, junctions having depths of 40 nm or less. Both N+/P and P+/N devices showed much lower leakage when compared with devices which had only nickel silicide, without the addition of iridium or cobalt. In particular, Applicant's method of adding iridium or cobalt improves the thermal stability of nickel germanosilicide formed on SiGe.

Figure 1:
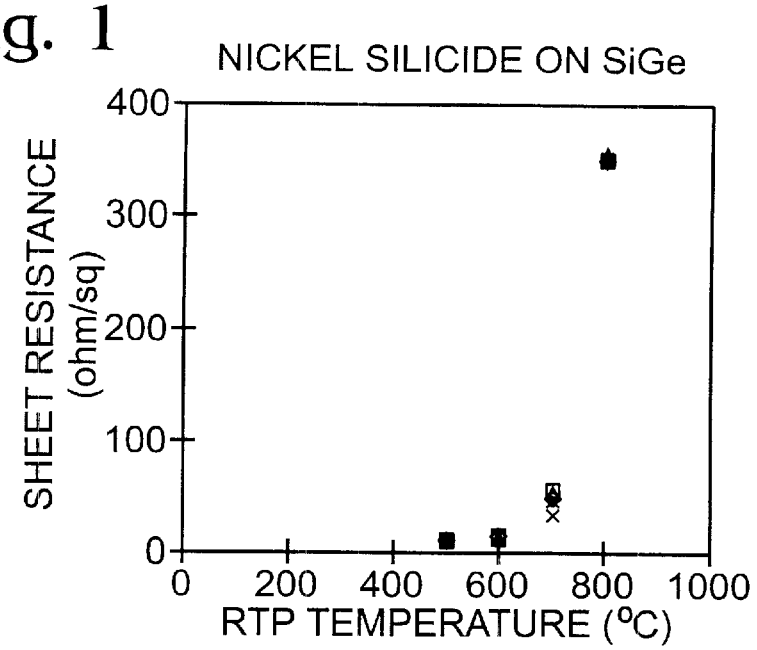
FIG. 1 is a plot of the annealing temperature versus the sheet resistance for nickel germanosilicide on SiGe.

Turning now to the figures, FIG. 1 shows a plot of the rapid thermal anneal (RTP) temperature versus the sheet resistance for a nickel germanosilicide film formed on a SiGe layer. In this figure the x-axis represents the rapid thermal annealing temperature in degrees Celsius. The y-axis represents the sheet resistance in ohm/square. In this device there was no iridium or cobalt addition during the fabrication process. An increase in the sheet resistance can be seen at a temperature of about 700° C. Many fabrication steps in today's integrated circuit processes require devices to undergo temperatures greater than 700° C. Accordingly, the nickel germanosilicide device, fabricated without iridium or cobalt addition, will not function satisfactorily after being subjected to processing steps at a temperature at or above 700° C.

Figure 2:
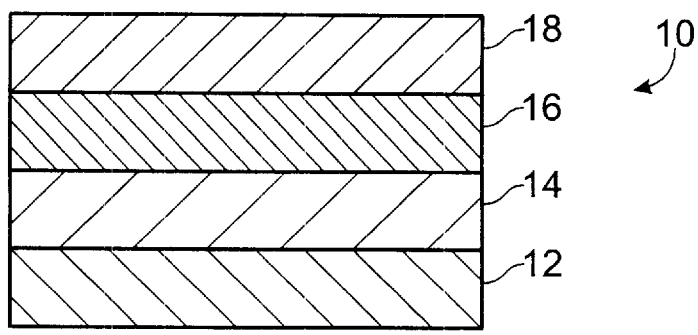
FIG. 2 is a schematic of one embodiment of the device of the present invention before annealing.

FIG. 2 is a schematic of the device of the present invention after deposition and prior to annealing, for one particular set of method steps. Device 10 comprises a substrate 12 including a silicon germanium (SiGe) layer 14. Layer 14 typically comprises a silicon germanium layer as known in the art. This silicon-germanium can be either single crystalline or polycrystalline. On source and drain regions, it typically is single crystalline. On polycrystalline lines, it becomes polycrystalline. An iridium or a cobalt layer 16 is deposited on silicon germanium layer 14. A nickel layer 18 is deposited on the iridium or cobalt layer 16. The nickel layer 18 and iridium or cobalt layer 16 are preferably deposited on the device by physical vapor deposition, which may include sputtering and evaporation, or by chemical vapor deposition, which may include metal organic chemical vapor deposition. The iridium or cobalt layer can be deposited before the nickel layer, as shown, or the iridium or cobalt layer can be deposited on top of the nickel layer. In another set of method steps, the iridium or cobalt can be co-deposited with the nickel to form a single layer on SiGe layer 14.

In particular, the deposition process may comprise sputtering and evaporation or chemical vapor deposition (CVD) such as metal organic chemical vapor deposition (MOCVD). Incorporation of the iridium or cobalt into the nickel can be accomplished by any of the following methods: deposition of iridium or cobalt prior to the nickel deposition; deposition of the iridium or cobalt in between nickel depositions; deposition of the iridium or cobalt after the nickel deposition; co-deposition of the iridium or cobalt and nickel from two sources, i.e., a nickel source and either a iridium or a cobalt source; and deposition of the iridium or cobalt and nickel from an alloyed target contained both desired materials. The nickel and the iridium or cobalt layers are each typically deposited on the source, drain and polysilicon areas of device 10, as will be understood by those skilled in the art. After annealing of the nickel and the iridium or cobalt layers, standard etch processes are carried out to finalize fabrication of the device, as will be understood by those skilled in the art.

Figure 3:
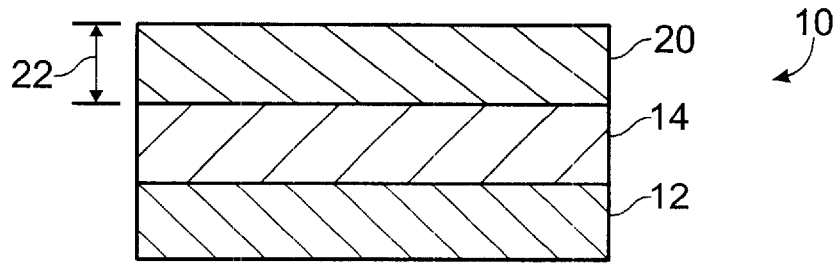
FIG. 3 is a schematic of the device of FIG. 2 after annealing.

FIG. 3 is a schematic of the device of FIG. 2 after annealing. Device 10 comprises substrate 12 with silicon germanium layer 14 thereon. A nickel germanosilicide layer 20, having either iridium or cobalt therein, is positioned on silicon germanium layer 14. Layer 14 in FIG. 3 is considerably thinner than layer 14 in FIG. 2, due to the consumption of silicon-germanium in the reaction with nickel and cobalt to form germanosilicide. The atomic percentage of iridium or cobalt in nickel germanosilicide layer 20 preferably is in the range of 2% to 25%. The thickness 22 of nickel germanosilicide layer 20 preferably is in the range of 50 to 350 Angstroms (A). After annealing, the device comprises a nickel germanosilicide silicon germanium structure having the formula $Ni(Si_xGe_{1-x})_y/Si_xGe_{1-x}$, wherein iridium or cobalt is complexed within the nickel germanosilicide. In this formula, x typically is in a range of 0.1 to 0.9, and preferably is in a range of 0.2 to 0.4, and y typically is either 1 or 2, depending on the annealing temperature. The iridium or cobalt typically comprises an atomic percentage of the nickel germanosilicide layer in a range of two to twenty five percent.

After deposition of nickel layer 18 and iridium or cobalt layer 16, the silicidation step is performed in an inert ambient or in a nitrogen ambient at a temperature in a range of 300 to 800° C., for a time period in a range of 10 seconds to two minutes. After this annealing step, a selective etch is performed in a Piranha solution, which consists of sulfuric acid and hydrogen peroxide. The etch temperature preferably is between 100 and 150° C.

An example of a particular fabrication process is set forth. First, the substrate is dipped into a pre-metal dip in a dilute buffered hydrogen fluoride (HF) solution for twenty seconds. The substrate is then loaded into the deposition system, or chamber. A cobalt film is then deposited having a thickness of approximately 15 Angstroms. A nickel film is then deposited having a thickness of approximately 75 Angstroms. The device is then subjected to a rapid thermal anneal (RTA) in an argon atmosphere at about 550° C. for about sixty seconds. The structure is then subjected to subsequent processing as known in the art, which may be at temperatures of 800° C. or higher. The device as fabricated herein shows thermal stability during such high temperature processing steps and shows acceptable sheet resistance values. Accordingly, the device of the present invention is stable during process steps conducted at temperatures of 800° C. or higher.

FIG. 4 is a plot of the annealing temperature versus the sheet resistance for a nickel germanosilicide film formed on SiGe with iridium added at the Ni/SiGe interface. In this figure the x-axis represents the rapid thermal annealing temperature in degrees Celsius. The y-axis represents the sheet resistance in ohm/square. The device shows a 100° C. increase in the thermal stability of the device compared to the nickel germanosilicide silicon germanium device of FIG. 1, without iridium or cobalt added. In particular, the device of FIG. 4 shows thermal stability at rapid thermal annealing temperatures up to about 800° C. In particular, the device has a sheet resistance of less than 50 ohm/square in a rapid thermal annealing temperature range of 400 to 800° C. However, beyond 800° C., there is a rapid increase in the sheet resistance, which is probably due to agglomeration or phase separation of the germanosilicide phase. The nickel germanosilicide of the present invention, with a stabilizer metal of iridium or cobalt incorporated therein, is particularly suited for use in ultra-shallow junctions having junction depths of 50 nm or less.

FIG. 5 is a plot of the annealing temperature versus the sheet resistance for a nickel germanosilicide film formed on SiGe with cobalt added at the Ni/SiGe interface. In this figure the x-axis represents the rapid thermal annealing temperature in degrees Celsius. The y-axis represents the sheet resistance in ohm/square. The device shows thermal stability at rapid thermal annealing temperatures up to and beyond 800° C. In particular, the device has a sheet resistance of less than 30 ohm/square in a rapid thermal annealing temperature range of 400 to 800° C. Applicants note that a decrease in the sheet resistance actually takes place with increasing temperatures. Accordingly, as shown by the FIG. 5, the resistance of the device remains low even when the device is subjected to temperatures greater than 800° C. and up to 850° C. In other words, the device has a sheet resistance of less than 20 ohm/square at a rapid thermal annealing temperature greater than 800° C.

FIG. 6 is a flowchart of the method of the present invention. Step 30 comprises providing a substrate having a SiGe layer. Step 32 comprises depositing an iridium or a cobalt layer. Step 34 comprises depositing a nickel layer. Steps 32 and 34 may be conducted in any order and may be combined into a single step wherein the nickel and iridium, or the nickel and cobalt, are co-deposited at the same time. The deposition step typically comprises depositing a layer of cobalt or iridium stabilizing metal having a thickness in a range of 10 to 20 Angstroms, and depositing a layer of nickel having a thickness in a range of 50 to 100 Angstroms. The nickel and iridium or cobalt may be deposited on the source, drain and polysilicon areas of the device by a variety of deposition methods. Step 36 comprises annealing the device. Step 38 comprises etching the device as desired. This process results in the device as shown in FIG. 3, which comprises an integrated circuit device including a nickel germanosilicide on SiGe having a stabilizing metal therein, having thermal stability at temperatures above 700° C. and up to and beyond 800° C. The nickel germanosilicide layer includes a stabilizing metal of either iridium or cobalt therein.

Thus, a thermally stable nickel germanosilicide on SiGe integrated circuit device, and a method of making the same, has been disclosed. Although preferred structures and methods of fabricating the device have been disclosed, it should be appreciated that further variations and modifications may be made thereto without departing from the scope of the invention as defined in the appended claims.

We claim:

1. A nickel germanosilicide silicon germanium integrated circuit device, comprising:
    a silicon germanium layer positioned on a substrate; and
    a nickel germanosilicide layer positioned on said silicon germanium layer, wherein said nickel germanosilicide layer includes a stabilizing metal therein, wherein said stabilizing metal is chosen from the group consisting of iridium and cobalt.

2. The device of claim 1 wherein said stabilizing metal comprises an atomic percentage of said nickel germanosilicide layer in a range of two atomic percent to twenty five atomic percent.

3. The device of claim 1 wherein said device has a sheet resistance of less than 50 ohm/square throughout a rapid thermal annealing temperature range of 400 to 800° C.

4. The device of claim 1 wherein said device has a sheet resistance of less than 50 ohm/square at a rapid thermal annealing temperature greater than 800° C.

5. The device of claim 1 wherein said nickel germanosilicide and said silicon germanium define the structure $Ni(Si_xGe_{1-x})_y/Si_xGe_{1-x}$, wherein x is in a range of 0.1 to 0.9, and wherein y is chosen from the group consisting of one and two.

6. The device of claim 1 wherein said nickel germanosilicide layer defines a thickness in a range of 50 to 350 Angstroms.

7. The device of claim 1 wherein said device includes an ultra-shallow junction having a junction depth of less than 51 nm.

8. A nickel germanosilicide silicon germanium integrated circuit device, comprising:
    a silicon germanium layer positioned on a substrate; and
    a nickel germanosilicide layer positioned on said silicon germanium layer, wherein said nickel germanosilicide layer includes a stabilizing metal therein, and wherein said device has a sheet resistance of less than 50 ohm/square throughout a rapid thermal annealing temperature range of 400 to 800° C.

9. The device of claim 8 wherein said stabilizing metal is chosen from the group consisting of iridium and cobalt.

10. The device of claim 9 wherein said stabilizing metal comprises an atomic percentage of said nickel germanosilicide layer in a range of two atomic percent to twenty five atomic percent.

11. The device of claim 8 wherein said device has a sheet resistance of less than 50 ohm/square at a rapid thermal annealing temperature greater than 800° C.

12. The device of claim 8 wherein said nickel germanosilicide and said silicon germanium define the structure $Ni(Si_xGe_{1-x})_y/Si_xGe_{1-x}$, wherein x is in a range of 0.2 to 0.4, and wherein y is chosen from the group consisting of one and two.

13. The device of claim 8 wherein said nickel germanosilicide layer defines a thickness in a range of 50 to 350 Angstroms.

14. The device of claim 8 wherein said device includes an ultra-shallow junction having a junction depth of less than 51 nm.

* * * * *